United States Patent [19]
Scott et al.

[11] Patent Number: 5,935,733
[45] Date of Patent: *Aug. 10, 1999

[54] PHOTOLITHOGRAPHY MASK AND METHOD OF FABRICATION

[75] Inventors: Charles R. Scott, Sunnyvale; Patrick M. Troccolo, Palo Alto, both of Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/782,981

[22] Filed: Jan. 14, 1997

Related U.S. Application Data

[63] Continuation-in-part of application No. 08/628,184, Apr. 5, 1996, Pat. No. 5,795,684.

[51] Int. Cl.⁶ ....................................................... G03F 9/00
[52] U.S. Cl. ................................................................ 430/5
[58] Field of Search ............................... 430/5, 322, 323, 430/324

[56] References Cited

U.S. PATENT DOCUMENTS

| | | | |
|---|---|---|---|
| 5,437,947 | 8/1995 | Hur et al. | 430/5 |
| 5,480,747 | 1/1996 | Vasudev | 430/5 |
| 5,514,498 | 5/1996 | Nakagawa | 430/5 |
| 5,536,604 | 7/1996 | Ito | 430/5 |

OTHER PUBLICATIONS

"Wavefront Engineering for Photolithography", Marc D. Levenson, Jul. 1993, Physics Today.
"What IS Phase–Shifting Mask?", Marc D. Levenson, 1990, SPIE Vo. 1496 10th Annual Symposium on Microlithography.

*Primary Examiner*—S. Rosasco
*Attorney, Agent, or Firm*—Naomi Obinata

[57] ABSTRACT

A novel mask for photolithography in semiconductor processing and fabrication method is disclosed. The mask includes a layer of transmissive material transparent to the wavelength of light to be used deposited thereon. The transmissive material is plasma etched in accordance with a pattern in photoresist deposited thereon to create trench portions in the transmissive material. A layer of absorbing material absorptive to the wavelength of light to be used is deposited within the trench portions. The surface of the mask is then planarized to create a substantially smooth mask layer having trench portions in the transmissive material and absorbing layer portions within the trench portions. If desired, a second layer of transmissive material can be deposited over the smooth mask layer to provide a protective cap to create an overall smooth, flat completed mask surface. The mask is useful for transmissive photolithography applications as well as reflective photolithography applications. The invention is also useful for forming a phase shifting mask.

17 Claims, 8 Drawing Sheets

PHOTOLITHOGRAPHY MASK AND METHOD OF FABRICATION

This is a continuation-in-part of U.S. patent application Ser. No. 08/628,184, filed Apr. 5, 1996 now U.S. Pat. No. 5,795,684.

BACKGROUND OF THE INVENTION

1. Field of the Invention

The present invention relates to the field of semiconductor processing, and more specifically relates to a novel mask structure for use in photolithography and fabrication process thereof.

2. Discussion of Related Art

Modern integrated circuits are made of millions of devices fabricated on a substrate. The substrate is usually a silicon device wafer. The devices are fabricated in a sequence of deposition of a thin film of semiconductor, insulator or conductive material and patterning the material in accordance with a preselected device layer layout pattern for the given material. The patterning step involves photolithography and etching.

Photolithography is commonly carried out in a tool known as a "stepper". The photolithography sequence typically is as follows: a silicon device wafer substrate having a layer of film to be patterned covered with a layer of photoresist is placed within a stepper onto a stage. A mask is placed above and over the device wafer. The mask contains the pattern that is to be replicated onto the device wafer. Usually the mask dimensions are larger than the dimensions to be printed onto the photoresist; a series of reducing lenses focus the pattern to be the size desired for printing on the photoresist. In the case of a transmissive mask the mask pattern is created by transmissive and absorbing material portions arranged in a pattern on the mask. When light of a selected wavelength, for example, 248 nanometers ("nm"), is applied to the mask, the "transmissive" portions of the mask, which are transparent to the selected wavelength, allow the light to pass through the mask and the "absorbing" portions, which are opaque to and absorb the selected wavelength, block the light transmission. The pattern on the mask is thereby replicated onto the photoresist on the device wafer. If a reflective mask is used, the mask surface contains reflective portions and absorbing portions. When light of a selected wavelength is applied to the mask the light is reflected off the reflecting portions. The reflected image from the mask usually is further reflected off a mirror or mirror-coated lens or series of mirrors or mirror-coated lenses and then onto the device wafer. Once exposed, the photoresist on the device wafer is developed by rinsing in a solution that dissolves selected portions of the photoresist to create a pattern in the photoresist matching the pattern of the mask. Following photolithography is etching. The pattern in the photoresist is typically etched into the underlying film material on the device wafer using gas plasma, resulting in a transfer of the pattern in the photoresist to the film material. These steps of deposition, photolithography, and etching are done repeatedly in the semiconductor fabrication process until the integrated circuit device is completed.

Figure 1A:
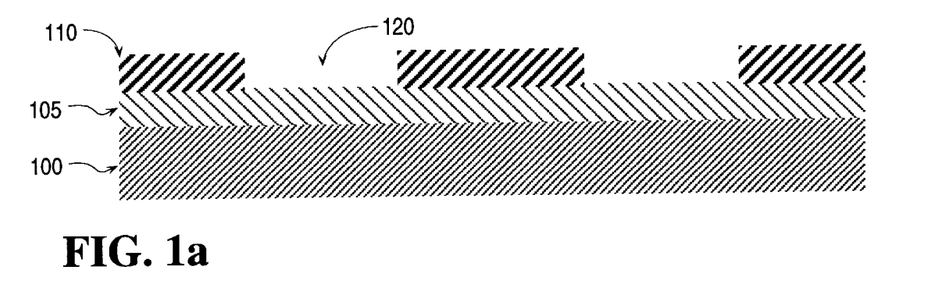
FIG. 1a is an illustration of a cross sectional view of a presently used mask in partially fabricated form.
Figure 1B:
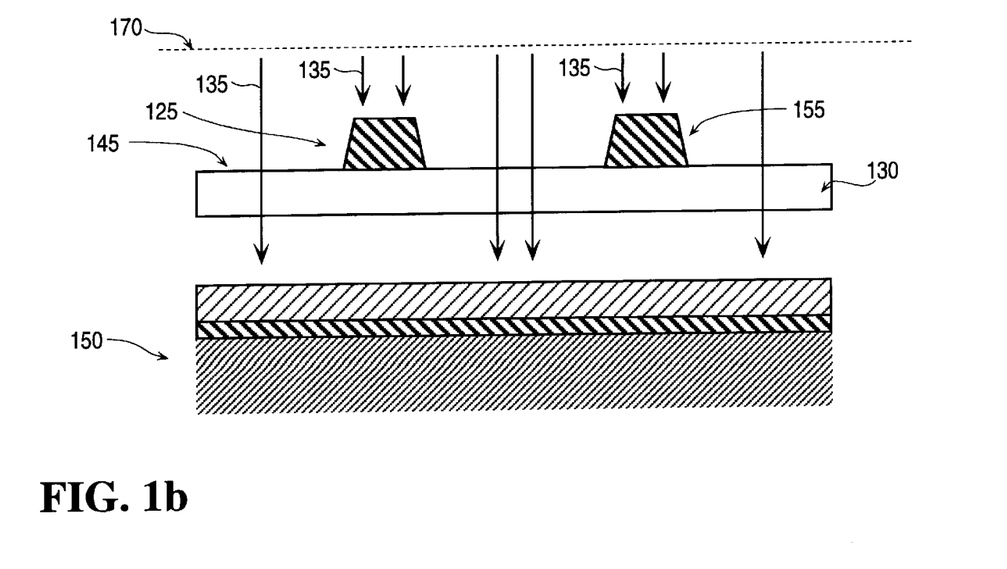
FIG. 1b is an illustration of a cross sectional view of a presently used mask having wet-etched chromium absorbing portions.

The currently used mask for photolithography is fabricated by a sequence similar to the deposition, photolithography and etching sequence described above. As depicted in FIG. 1a, there is typically provided a transmissive quartz substrate 100. A light-absorbing layer, typically chromium 105, is deposited onto the substrate 100. Photoresist 110 is deposited onto the chromium 105, and an electron beam which is controlled by a computer (not shown) writes a preselected layout pattern onto the photoresist, leaving openings 120 in the photoresist where the electron beam was applied to create a patterned photoresist. The chromium is etched using wet etchants to open selected areas in the chromium to create a patterned chromium 125 as shown in FIG. 1b. The photoresist 110 is then removed and the mask is complete.

The completed mask 130 is placed within a stepper so that light 135 at a preselected wavelength can be shone onto the mask so that the patterned chromium 125 absorptive portions absorb and block the light from passing through and the transmissive portions 145 allow the light to pass through onto a photoresist-covered device wafer 150 below.

As can be seen in FIG. 1b, the patterned chromium 125 following wet etch contains non-vertical sidewalls 155. Having non-vertical sidewalls generally is not a problem for attaining accurate patterning for typically used photolithography wavelengths down to about 248 nm to pattern 0.35 micron feature sizes. It is desirable, however, to have vertical sidewalls to ensure flexibility of the mask for enabling accurate patterning of even smaller feature sizes.

The maskmaking process also includes removal or repair of defects. Defects need to be removed or repaired because their presence causes undesired pattern transfer from the mask to the wafer. This is done typically using laser ablation or focused ion beam ("FIB"). Defect removal creates its own set of problems in that, if laser ablation is used the underlying substrate can fairly easily be damaged, and while FIB does not pose the same degree of risk of damage to the substrate, the gallium source used for ions creates a "staining", or doping effect in the substrate. Damage or staining in the substrate causes defective light transmission of the desired mask pattern, resulting in poor quality photolithography and possibly defective device wafer patterns, necessitating fabrication of a new mask.

Once the mask fabrication is complete, the mask is protected by a protective cover known as a "pellicle" 170. Without a pellicle, a new mask would almost immediately be rendered unusable. Photolithography is done in an ambient environment where particles are present, even in the cleanest of ambient environments. Cleaning off the particles from the mask can be very difficult because the tight spacing between absorbing layer structures tends to catch particles. In addition, the mask surface is so fragile that even the gentlest handling to clean off particles can create damage to the mask. The pellicle 170 essentially enables a mask to be used in production by accommodating the particles by shielding the mask from particles falling downward perpendicular to the mask. The pellicle 170 is typically made of an organic membrane that is stretched across a metal or plastic frame and is held horizontally parallel to the mask a distance away from the mask surface.

Device line dimensions are shrinking. Presently research is being carried out to enable fabrication of 0.25 microns dimension. It is anticipated that there will be further shrinkage to 0.18 microns and so on in the near future. Photolithography must be carried out at shorter and shorter wavelengths to pattern successfully in shrinking dimensions. Patterning using 248 nm wavelength for 0.25 microns, and 193 nm and 13 nm as wavelengths for smaller sizes are all being currently explored.

Figure 2:
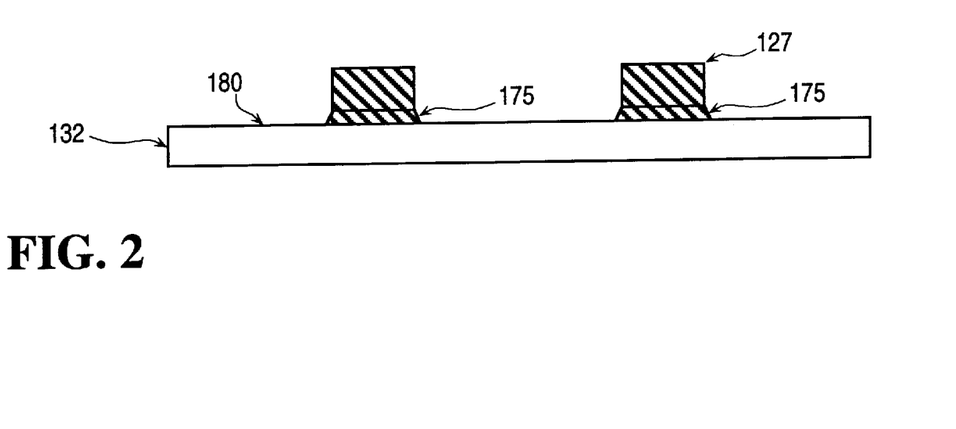
FIG. 2 is an illustration of a cross sectional view of a mask with plasma-etched absorbing portions.

To accommodate the shorter wavelengths, novel mask designs, materials and fabrication methods are being explored. For example, as shown in FIG. 2, for 193 nm wavelength the current mask design is a quartz substrate 132 with chromium absorbing layer portions 127. The chromium absorbing layer portions 127 are created via plasma etching of the chromium instead of using wet etchants as in the case of the 248 nm mask. The reason for conversion to plasma etching from wet etching is that plasma etching can be done anisotropically to create vertical sidewalls in the absorbing layer. Vertical sidewalls in the absorbing layer are a necessity for 193 nm wavelength and below because of the greater need for accurate light transmission. However, plasma etching techniques for attaining clean vertical sidewalls in a metal film (such as chromium absorbing layer) are difficult to implement; usually the etched sidewalls contain residues 175 that render the sidewall unsmooth. Another limitation to plasma etching is that typically it is difficult to achieve a clean etch of the entire thickness of the metal film with sufficient selectivity to the underlying substrate material surface 180 such that the substrate surface 180 is clean, intact and not damaged by ion bombardment from the plasma.

The pellicle cannot be used for the shorter wavelengths. At 193 nm wavelength and below a reaction occurs between the light and the air trapped between the pellicle and the mask surface, creating ozone which breaks down the organic membrane film. The organic membrane pellicle as presently used is therefore not useful for the 193 nm and below wavelength regime.

Figure 3:
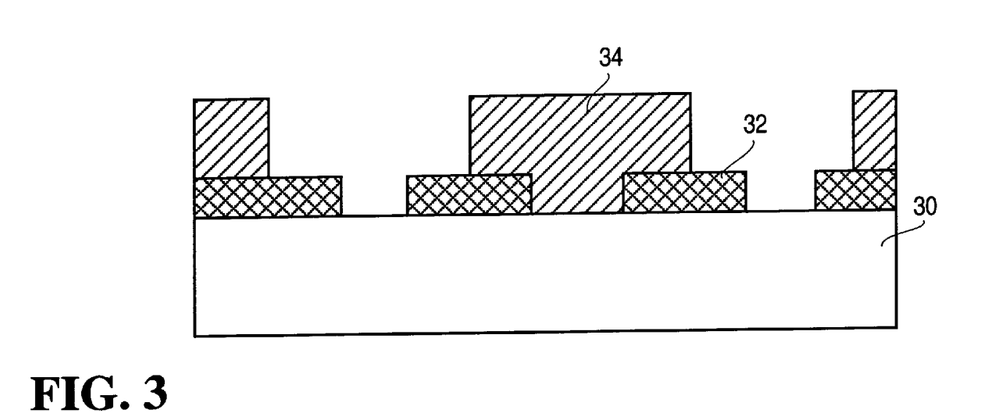
FIG. 3 is an illustration of a cross sectional view describing a conventional phase shifting mask using the "Levenson method" of fabrication.

A technique for accommodating technical limitations in going to shorter wavelengths but enabling patterning of smaller line widths is the phase shift mask. With a phase shift mask, the pattern resolution for a given wavelength is improved, thereby essentially extending the usefulness of a wavelength for smaller dimensions. Described in more detail in the article entitled, "What is a Phase Shifting mask?", by Marc Levenson, SPIE Vol. 1496 $10^{th}$ Annual Symposium on Microlithography (1990), pp. 20–26, phase shifting masks add into the mask structure materials having refractive indices that cause the phase of the light wave applied to shift by a predetermined phase. As shown in FIG. 3, typically, these phase shifting materials are deposited and etched in accordance with the "Levenson method" described in the cited article to create a mask structure having absorbing portions 32 and separate phase shifting portions 34. The phase shifting portions 34 rise above the plane of the absorbing portions 32 and overlap the absorbing portions 32 in predetermined areas. The location of phase shifting portions 34 relative to absorbing portions 32, as well as the shapes of the phase shifting portions 34 and the phase shift amount all depend on the shape and form of the pattern of the mask. Different phases, shapes and materials for the phase shifters are used for patterning various features such as straight lines, curved lines, square shapes, and round shapes. The advantages of being able to use multiple phase shifters is described in more detail in "Wavefront Engineering for Photolithography", by Marc Levenson, Physics Today, July 1993, pp. 28–36. The mask making process begins with a substrate 30 having a patterned absorbing layer 32. Patterned absorbing layer 32 is contained above the plane of the top surface of substrate 30. A phase shifting material layer 34 is deposited on the absorbing layer 32. A photolithography and etching sequence is used to create patterns in the phase shifting layer 34. Conventional phase shift masks are built in patterned layers of film built upward from a starting substrate surface. However, each layer of film builds complexity into the mask making technique. Materials are deposited and etched over structural steps and other topography to achieve the desired phase variations for a given pattern. Depositing and etching over topographic structures makes critical dimension control more difficult due to exposure variations that occur for differing film thicknesses encountered with non-planar underlying topography.

Identifying and repairing defects becomes more difficult with non-planar underlying topography. The more materials added to the conventional phase shift mask, the more levels of topographic mask structure there will be, adding in complexity to the mask and fabrication difficulty with each successive layer. With the needed precision and pattern dimension control required for mask making, one can appreciate that, using the conventional phase shifting mask, it is simply not feasible for large scale manufacturing to have more than one or at most two different phase shifting materials on a given mask. While one or two phase shifts may be useful for simple patterns, they are not enough for more complex patterns having a multitude of different shapes.

It would be advantageous to have a mask structure which contains absorbing layer portions having vertical sidewalls to enable accurate light transmission. It would be advantageous to have a mask structure which can accommodate a degree of damage or staining due to the defect removal process. It would be further advantageous to have a mask which can be used repeatedly without the presence of a pellicle. It would also be advantageous to have a mask where the fabrication technique can accomodate multiple phase shifting materials.

SUMMARY OF THE INVENTION

A mask structure for use in photolithography with a preselected wavelength of light is disclosed. There is a first layer of material transmissive to the preselected wavelength. The transmissive material includes at least one trench portion. An absorbing layer which is absorptive to the preselected wavelength of light is held within the trench portion.

A method of fabricating a mask for use in photolithography is also disclosed. A first layer of material that is transmissive to the wavelength of light to be used is provided. A layer of photoresist is deposited onto the first layer, then the photoresist is patterned to create open portions in the photoresist. The first layer is plasma etched through a portion of its depth such that the open portions in the photoresist are replicated therein to create trench portions. The photoresist is removed. An absorbing layer absorptive to the wavelength of light to be used is deposited into at least the trench portions in the first layer. Then, the surface the mask having the first layer and absorbing layer is planarized.

A phase shift mask structure for use in photolithography is also disclosed. There is a first layer of material that is transmissive to a preselected wavelength of light. A trench is in the first layer. A phase shifting material is held within the trench.

BRIEF DESCRIPTION OF THE DRAWINGS

FIG. 5b is an illustration of a cross sectional view of a further fabricated form of the mask of the invention in the example of a transmissive mask, from FIG. 5a.

FIG. 6b is an illustration of a cross sectional view of a further fabricated form of the mask of the invention in the example of a reflective mask, from FIG. 6a.

DETAILED DESCRIPTION OF THE PRESENT INVENTION

The present invention describes a novel mask structure and method of fabrication to enable photolithography in future, shorter wavelength regimes as well as to improve photolithography at the present wavelengths. In the following paragraphs numerous specific details are set forth such as specific materials, processes, and equipment in order to provide a thorough understanding of the present invention. It will be obvious however, to one skilled in the art, that the present invention may be practiced without these specific details. In other instances, well-known manufacturing materials, processes and equipment have not been set forth in detail in order to not unnecessarily obscure the present invention.

The present invention will be described first in terms of a mask structure having a pattern of transmissive material portions that are transparent to the wavelength of incident light and absorbing material portions that are opaque to and absorb the wavelength of incident light. Then, a method of fabrication of the mask structure will be described which utilizes a "Damascene" approach of depositing a transmissive material, etching a trench, depositing absorbing layer and planarizing the top surface to create the mask structure described. The method of fabrication will be described using two examples, one of a transmissive mask, the other of a reflective mask. Then, a capping layer for protecting the mask structure will be described. An alternative method of fabrication utilizing a sacrificial layer in lieu of depositing the transmissive material will also be described. Finally, the application of the invention to make a novel phase shift mask will be described.

Mask Structure

Figure 4:
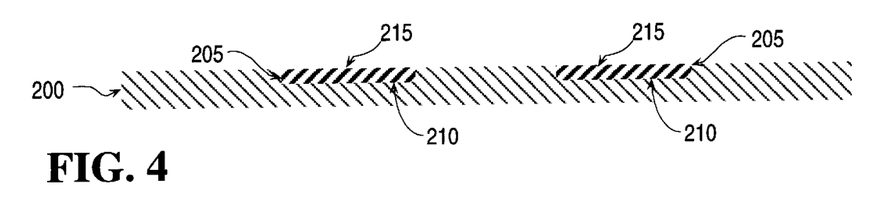
FIG. 4 is an illustration of a cross sectional view of an idealized depiction of a cross section of a completed mask of the present invention.

An idealized depiction of the mask of the present invention is shown in FIG. 4. As can be seen, the mask structure is a transmissive layer portion 200 having portions of absorbing material 215 held therein. One aspect of how this differs from the presently used, or traditional mask structure is that the absorbing material portions are held within trench portions as opposed to absorbing material portions being disposed above the plane of the transmissive layer. The transmissive material 200 is selected to be one that is capable of being cleanly etched in gas plasma so as to provide smooth etched substantially vertical sidewalls 205 in trench portions 210. The transmissive material is also transparent to the wavelength of light being used in the photolithography process. In the case of wavelengths of approximately 248 mn to 157 nm, the transmissive material 200 is preferably calcium fluoride, magnesium fluoride or indium tin oxide or other material transparent to the selected wavelength, such as, for example, quartz or silicon. In the case of shorter wavelengths such as 13 nm, the transmissive material 200 is silicon or other material transparent to the selected wavelength. The transmissive material or layer 200 should be sufficiently thick that it can support an absorbing material 215 held within the trench portions 210 of the transmissive layer 200, and sufficiently thin that it substantially allows the incident light to pass through the transmissive layer 200. The absorbing layer 215 is a material that absorbs all of the incident light and is opaque to the wavelength of light being used. In the case of approximately 248 nm to 193 nm, the absorbing layer is chromium. In the case of shorter wavelengths such as 13 nm, the absorbing layer is titanium or aluminum or other material that is opaque to the selected wavelength. How the structure of the mask is fabricated will be described next using the examples of a transmissive mask, followed by a reflective mask.

Transmissive Mask Fabrication Process

Figure 5A:
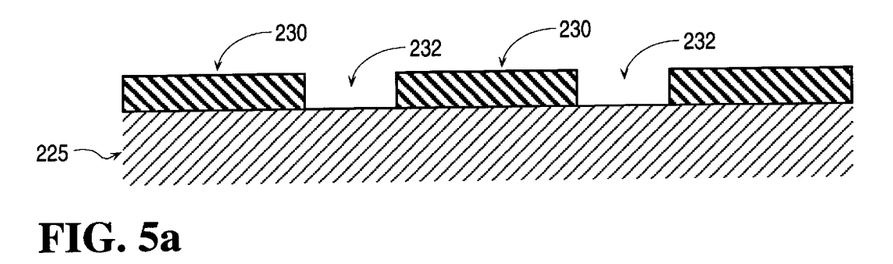
FIG. 5a is an illustration of a cross sectional view of a partially fabricated form of the mask of the invention in the example of a transmissive mask.
Figure 5B:
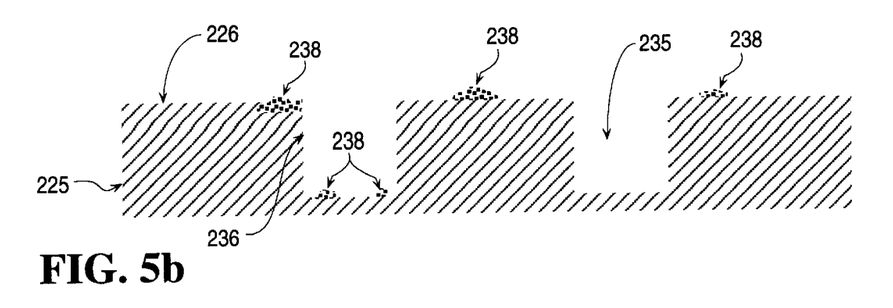

For a transmissive mask, the starting point can be a transmissive material layer 225 as shown in FIG. 5a. The transmissive material is any material that can be plasma etched and is transparent to the incident light. Note that, the transmissive material layer 225 is preferably deposited over a substrate (not shown) made of a material that is transparent to the selected wavelength. However, transmissive material layer 225 can also be the substrate itself. As shown in FIG. 5a, photoresist 230 is spun onto the transmissive material. The photoresist is of a thickness which is sufficiently thin to provide accurate patterning of a silicon wafer (not shown) but thick enough to withstand a subsequent plasma etch. A preselected layout pattern is written into the photoresist 230 using an electron beam or other similar method capable of creating fine features. The photoresist 230 is then developed to open patterns 232 in the photoresist 230 exposing portions of the transmissive material layer 225. As shown in FIG. 5b, the pattern in the photoresist 230 is transferred or replicated into the transmissive layer 225 by plasma etching using a commercially available plasma etcher using a known plasma etching process that etches into a film to create substantially vertical sidewalls in the etched film. The plasma etch is stopped before the transmissive material 225 is completely etched so as to form trenched or cutout portions 235. The photoresist 230 is then removed. The advantage of having the transmissive layer as the layer to be etched, in contrast with the absorbing layer as the layer to be etched is that the etch process for the transmissive layer is more robust and will tend to etch cleanly with vertical sidewalls. A further advantage is that any defects created during the etching process can be eliminated during the defect removal step (to be described below).

Figure 5C:
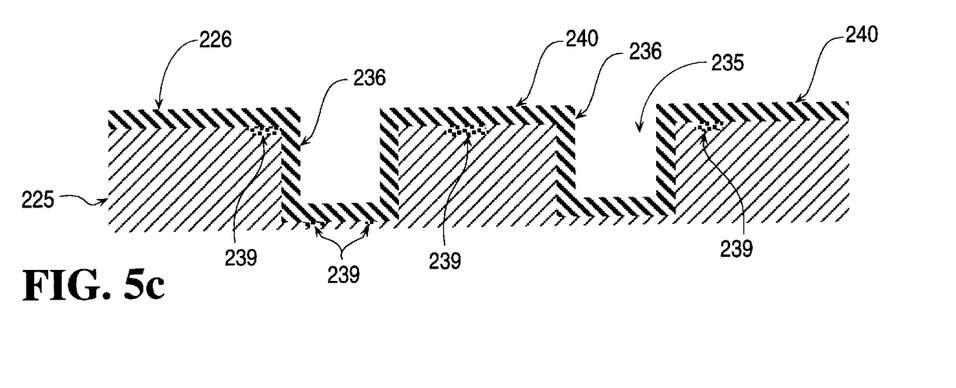
FIG. 5c is an illustration of a cross sectional view of a further fabricated form of the mask of the invention in the example of a transmissive mask, from FIG. 5b.

Following creation of the trench 235 in the transmissive material the mask is placed in an inspection tool such as the KLA 351 to inspect for defects 238 if any, arising from the etching step. If defects 238 are found, the defects are removed or repaired via the well-known methods of laser ablation or FIB (using Micrion 8000, for example) or another method similarly capable. The advantage of removing or repairing defects in the transmissive material is that, as shown in FIG. 5c, even if there remains some damage or staining 239 from the defect removal process, such damage or staining 239 will be covered over by the absorbing layer 240 within the trenches 235. The presence of such damage or staining therefore will not matter for purposes of the photolithography process because the light will be absorbed by the absorbing layer covering such damage or staining. If damage or staining 239 occurs in other areas, they will be removed in a subsequent planarization step.

Next, the absorbing layer 240 is deposited over the transmissive material 225. The absorbing layer 240 is any material that is opaque to and will tend to absorb the applied incident light wavelength. In the case of 193 nm wavelengths, the absorbing layer 240 is preferably chromium. The deposition process is a known process for depositing thin films of absorbing material (on the order of, for example, approximately 500 to 2000 Angstroms) such as chemical vapor deposition, sputter deposition or evaporation, so as to partially or completely fill the trench portions 235. The absorbing layer 240 will tend to deposit not only within the trenched portions 235 but also on the sidewalls of the trench portions 236 as well as on the top surface portions 226 of the transmissive material 225.

Figure 5D:
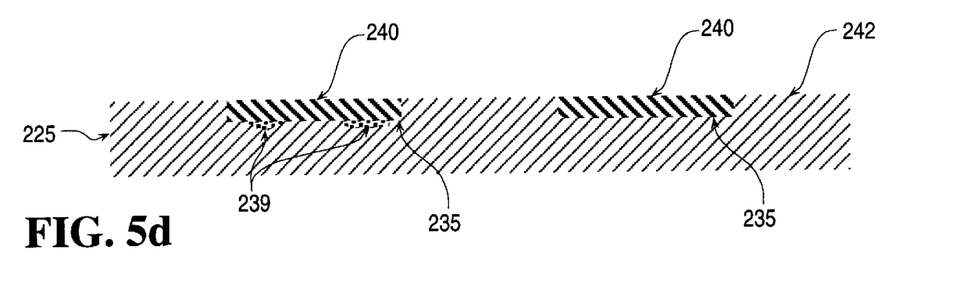
FIG. 5d is an illustration of a cross sectional view of the mask of the invention in the form of a transmissive mask, in planarized form in furtherance of the fabrication illustrated in FIGS. 5a–5c.

Following deposition of the absorbing layer 240 the mask is ready for planarization. Although planarization can be done in several known ways to provide a smooth, flat surface, the preferred method is to use chemical mechanical polishing. Chemical mechanical polish is the favored method of planarization because it is simple, inexpensive and enables a uniform planar finish. A commercially available polishing system using well-known polishing conditions and slurries is used. With chemical mechanical polishing, the entire mask surface including absorbing layer portions 240 deposited on sidewalls 236 of the trenched portions 235 is ground down to create an overall flat, smooth surface to the mask 242 as shown in FIG. 5d. The polishing process removes any staining or damage 239 following defect removal from exposed portions of the transmissive material 225 prior to deposition of the absorbing layer 240. If desired, this portion of the process can be carried out iteratively by partially polishing, inspecting for defects, removal of defects, adjusting the polishing to remove defect-causing effects, and so on. The end result is a completed mask as shown in FIG. 5d with a substantially smooth mask surface 242 and absorbing layer portions 240 that are clean with vertical sidewalls. When this step is complete, the mask is complete and ready for use.

Note how this basic fabrication technique removes the need for etching of the absorbing layer altogether. Moreover, the top surface of the completed mask structure is smooth and flat, as opposed to the traditional mask where the absorbing layer portions are disposed above the plane of the transmissive material. An advantage of having a smooth and flat mask structure over a topographical structure is that it is easier to detect particles and clean the surface of particles. In addition, because the absorbing layer is not raised up over the plane of the transmissive material layer the absorbing layer pattern is less prone to damage during handling.

Reflective Mask Fabrication Process

Figure 6A:
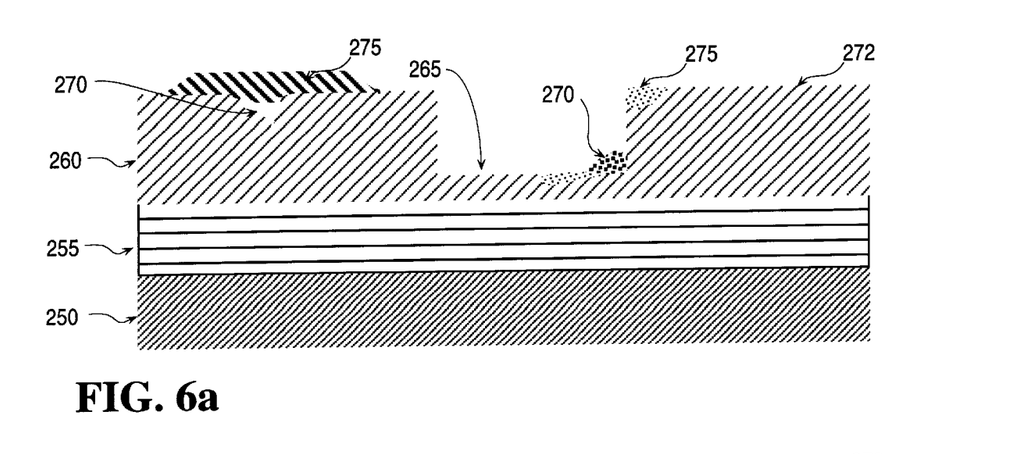
FIG. 6a is an illustration of a cross sectional view of a partially fabricated form of the mask of the invention in the example of a reflective mask.
Figure 6B:
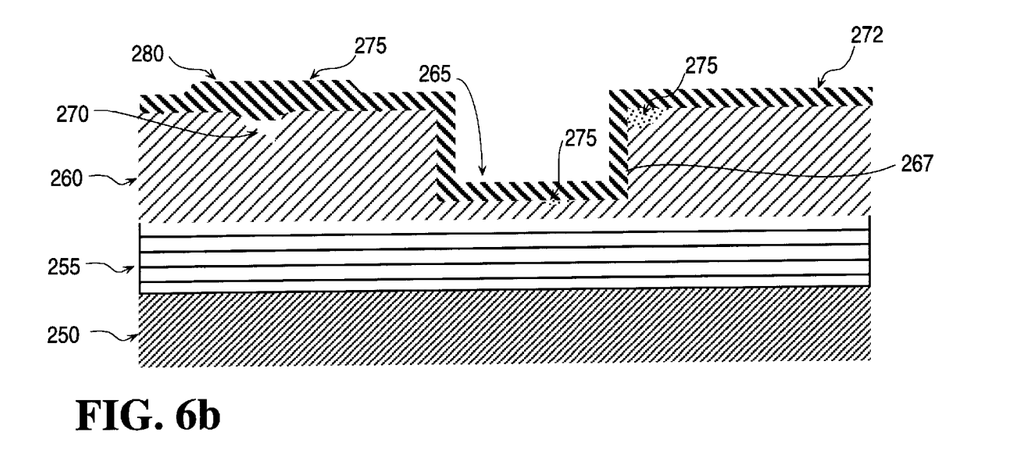
Figure 6C:
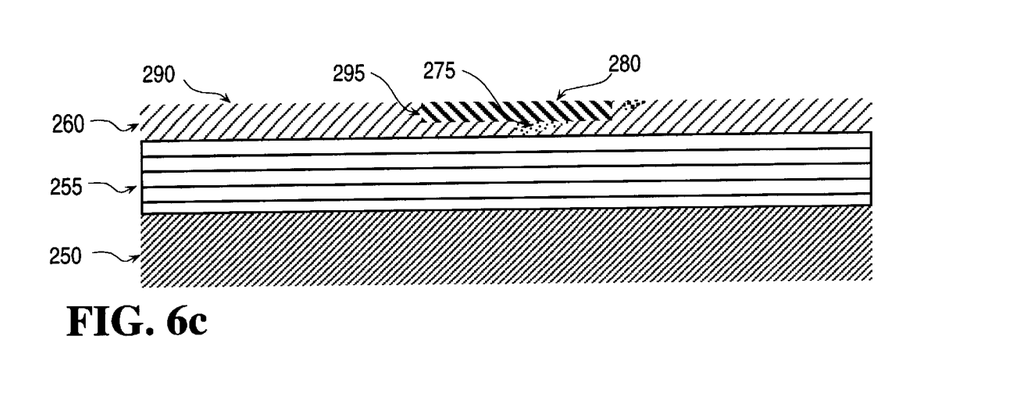
FIG. 6c is an illustration of a cross sectional view of the mask of the invention in the form of a reflective mask, in planarized form in furtherance of the fabrication illustrated in FIGS. 6a–6b.

In the case of a reflective mask, incident light reflects off portions of the mask to form a pattern that is transferred onto a photoresist-covered wafer or substrate via a series of mirror-coated lenses. Non-reflecting portions of the mask surface are typically absorptive, although transmissive portions can be used. The fabrication process in the case of a reflective mask is shown in FIGS. 6a–6c. As shown in FIG. 6a, a mask substrate 250 prepared with a reflective surface 255 is used, and the mask structure is built thereon. The reflective surface is usually a single layer metal such as aluminum that provides a reflective surface for incident light wavelengths down to about 120 nm. At still smaller wavelengths, the needed reflectance is typically obtained using a more complex reflective surface structure known as a resonant reflector. The resonant reflector is the embodiment shown for the reflective surface 255. A resonant reflector is described in the example for a mask for 13 nm wavelength photolithography described below.

The preferred embodiment for the underlying substrate 250 is silicon. Other materials, such as quartz, or any other material (whether transparent or opaque to the applied wavelength) on which the mask can be fabricated, can be used. The advantage of using silicon as the underlying substrate material is that a silicon wafer can be conveniently used.

For use in the 13 nm wavelength regime, it is preferred that the substrate 250 is first prepared by applying sheets of thin films of alternating reflective and transmissive materials to create a resonant reflecting mirror surface 255. The number of sheets, the reflective material and relative thicknesses are determined based on a number of factors including the wavelength of light and reflectivity of the material and resonance of the light waves to attain the maximum accurate reflection. In the example provided here, 80 sheets of alternating 28 angstrom molybdenum and 40 angstrom silicon are used; the topmost sheet of the reflective surface 255 is silicon to provide protection to the topmost sheet of resonant reflecting mirror surface.

Over the topmost sheet of the reflective surface 255 a fairly thick layer of transmissive material 260, for example, 1000–1500 angstroms, is deposited. The thickness of this transmissive layer 260 should be less than the depth of focus for the defect inspection tool being used (to be described further below). The transmissive material is selected to be that which is transmissive to the wavelength of light being used. In the embodiment for 13 nm wavelength regime, silicon is used in transmissive layer 260 because of its transparency to 13 nm wavelength. The transmissive material layer 260 can be single crystal silicon, polycrystalline silicon or amorphous silicon. The transmissive material 260 is deposited using chemical vapor deposition or another known technique that enables deposition of the desired film without causing the underlying reflective and transmissive material sheets to flow or diffuse or otherwise lose their effectiveness. Patterning of the transmissive material 260 is done using a technique similar to that described above, starting with patterned photoresist (not shown). The substrate 250 having the transmissive layer 260 is then placed in a commercially available plasma etcher, and the silicon transmissive layer 260 is etched partway down to create trench cutout portions 265. The etch depth is chosen to be a distance above the surface of the substrate 250 and reflective portion 255 so that the subsequently deposited absorbing layer and any defects at the bottom of the trench 265, should they occur, will not impinge on the substrate 250 and reflective portion 255. An alternative is to apply a very thin transmissive material coating and plasma etch all the way through the transmissive material as well as through the reflective portion to create a trench cutout portion in the substrate itself. The advantage of having the silicon transmissive layer as the layer to be etched, in contrast with the absorbing layer as the layer to be etched is that the etch process for silicon is robust and more reliable than an etch process used for an absorbing layer and will tend to etch cleanly with vertical sidewalls. A further advantage is that any defects created during the etching process can be eliminated during the defect removal step (to be described below). Moreover, in the case of the conventional process of plasma etching the absorbing material, it is nearly impossible to completely and cleanly etch all of the way through a metallic absorbing layer without etching into the reflective portion because the same gases used to etch the metallic absorbing layer also etch silicon. Etching trenches into the transmissive layer avoids the problem associated with plasma etching the metallic absorbing layer.

Following creation of the trench cutout portions 265, the remaining photoresist is removed using a known process of plasma etching or wet etching (not shown). Then, the mask is placed in an inspection tool such as the KLA 351 to inspect for defects 270 if any, arising from the etching step. If defects 270 are found, the defects are removed or repaired via the well-known methods of laser ablation or FIB (using Micrion 8000, for example) or another method similarly capable. The advantage of removing or repairing defects in the transmissive material is that, even if there remains some damage or staining 275 from the defect removal or repair process, such damage or staining 275 will be covered over by the absorbing layer 280 within the trenches 265 as shown in FIG. 6b. The presence of such damage or staining in the trench areas will not matter because the applied light will be absorbed by the absorbing layer 280 covering such damage or staining 275 in the trenches 265. If defects 270 or staining 275 occur in other areas, they will be removed in a subsequent planarization step. Note that this advantage of being able to remove defects is not present in the conventional process for making masks, which does not involve planarization.

As shown in FIG. 6b, following inspection and removal of defects in the transmissive material 260, a film of absorbing layer 280 is deposited. In the example of 13 nm wavelength the absorbing layer is preferably titanium or aluminum or other material having the characteristic of being opaque to the applied light wavelength. The deposition technique is a known chemical vapor deposition, sputter or evaporation or other technique that provides for deposition without causing the underlying reflective and transmissive sheets to flow or diffuse or otherwise lose their effectiveness. The deposited absorbing layer 280 fills or partially fills the trench cutouts 265 and deposits on the sidewalls 267 of the trench cutouts and deposits on the top surface portions 272 of the transmissive material layer 260. Note that the deposition may not entirely fill the volume of the trench portions 265. The absorbing material 280 in the trench 265 will be subsequently thinned during a following planarization step, so that the final thickness of the absorbing layer is determined subsequent to planarization. The post-polish thickness of the absorbing layer 280 is in the example of 13 nm wavelength approximately 500 angstroms in the case of titanium, and is approximately 800 angstroms in the case of aluminum.

Following deposition of the absorbing layer 280 the mask is ready for planarization. Although planarization can be done in several known ways to provide a smooth, flat surface, the preferred method is to use chemical mechanical polishing. Chemical mechanical polish is the favored method of planarization because it is simple, inexpensive and enables a uniform planar finish. A commercially available polishing system using well-known polishing conditions and slurries is used. With chemical mechanical polishing, the entire mask surface including absorbing layer portions deposited on sidewalls of the trenched portions 267 is ground down to create an overall flat, smooth surface to the mask having absorbing layer portions embedded in the transmissive layer as shown in FIG. 6c. The polishing process removes any staining or damage 275 following defect removal from the top surface portions 272 of the transmissive material 260. If desired, this portion of the process can be carried out iteratively by partially polishing, inspecting for defects, removal of defects, adjusting the polishing to remove defect-causing effects, and so on. The end result is a completed mask as shown in FIG. 6c with a substantially smooth mask surface 290 and absorbing layer portions 280 that are clean with vertical sidewalls 295. When this step is complete, the mask is complete and ready for use.

Capping Option

Figure 7:
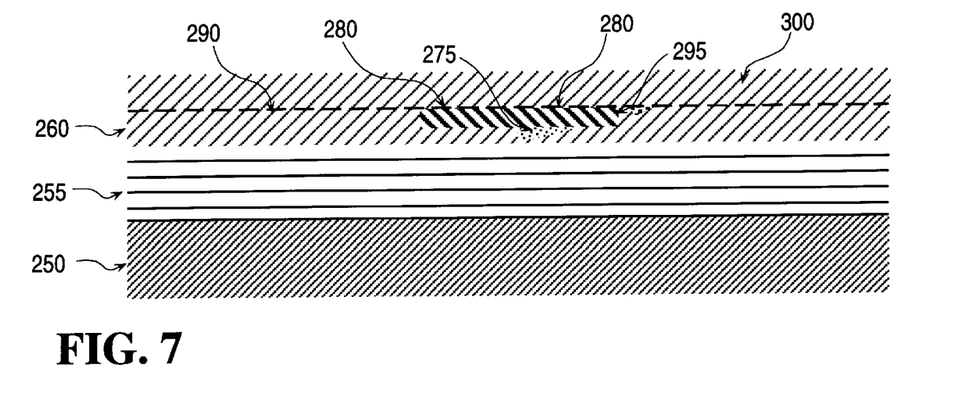
FIG. 7 is an illustration of a cross sectional view of the mask first depicted in FIG. 4, wherein the mask is capped.

An option in the case of either transmissive mask or reflective mask, fabricated using the process disclosed herein or, for that matter, using a conventional or other process, is to do an additional processing step of capping the surface of the polished mask with a second layer of transmissive capping material 300 as illustrated in FIG. 7. Using the example of the above-described reflective mask, the transmissive capping material 300 is preferably the same material as the transmissive layer 260. The capping material 300 is deposited onto the top surface 290 of the transmissive layer 260 using chemical vapor deposition or other known technique that will not subject the underlying absorbing layers or reflective layers to flowing or diffusion or other loss of effectiveness. If needed, the top surface of the capping material 300 following deposition can be smoothed out by chemical mechanical polishing or other known planarization method to form a smooth and flat final mask top surface. The capping material 300 thickness should be the maximum thickness possible to enable a substantially defect-free film and adequately protect the mask structure while providing for clean, accurate transmission of incident light.

Figure 8:
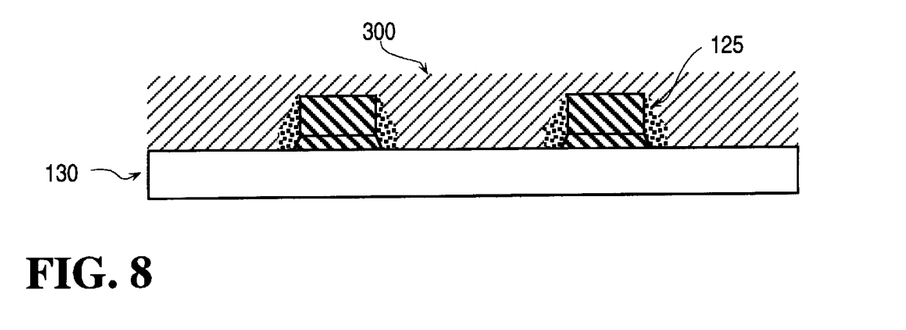
FIG. 8 is an illustration of a cross sectional view of a traditional mask having a capping layer.

It should be noted that, as shown in FIG. 8, the capping layer can be added onto any mask if desired, including the traditional mask with wet-etched absorbing portions 125 standing above the plane of the transmissive surface 130. The transmissive capping material layer 300 in the case of FIG. 8 is deposited onto the mask such that it fills all the spaces between the absorbing layer portions 125 and completely covers the top of the absorbing layer portions 125. If needed, the capping material layer 300 can be planarized using chemical mechanical polishing or other known planarization method to form a smooth and flat final mask top surface.

The resulting mask following application of the capping material layer has a protective coating, a kind of pellicle, for the absorbing layers which can tend to be more fragile than silicon. The protective coating also can provide a smooth finish to an otherwise topographic mask surface to improve the photolithography. Having a smooth and planar capping layer to protect the mask provides more flexibility in the photolithography process and allows effective in situ surface defect inspection. The stepper can be set up with an inspection module within the tool to enable easy inspection within the stepper and therefore improve throughput.

Sacrificial Layer Option

Figure 9A:
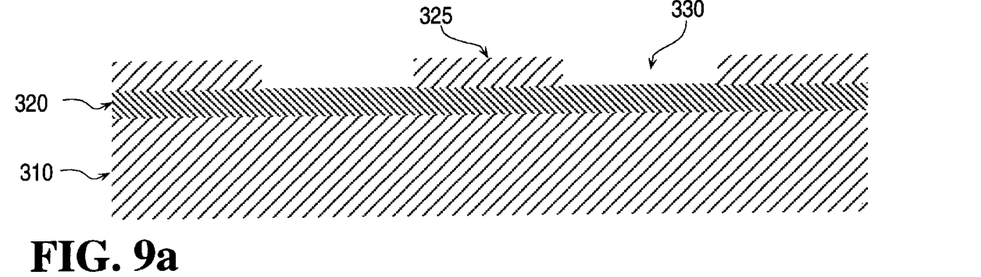
FIG. 9a is an illustration of a cross sectional view of an alternative fabrication process and mask embodiment, in partially fabricated form.
Figure 9B:
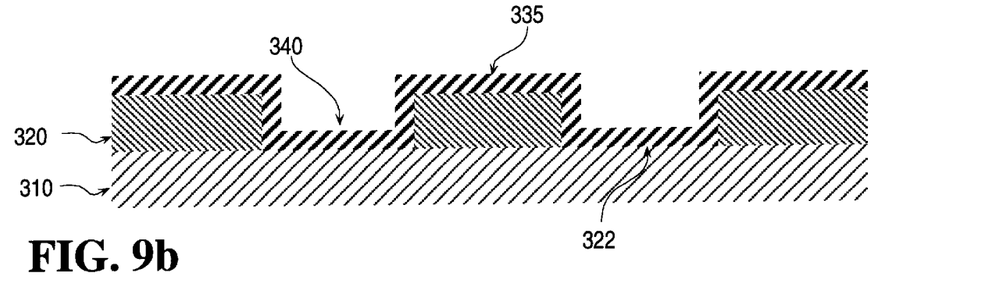
FIG. 9b is an illustration of a cross sectional view of an alternative fabrication process and mask embodiment, in further fabricated form from FIG. 9b.
Figure 9C:
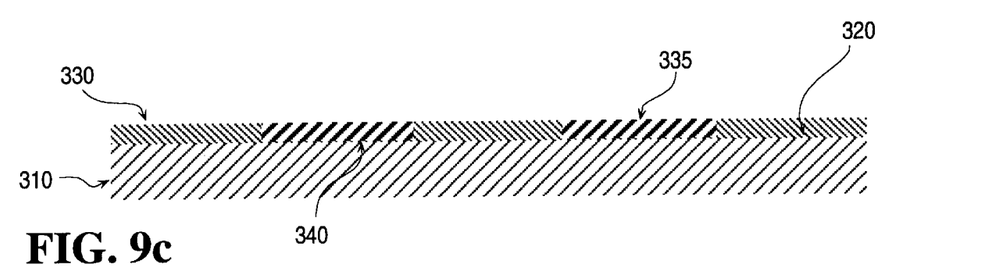
FIG. 9c is an illustration of a cross sectional view of an alternative fabrication process and mask embodiment, in further fabricated form from FIG. 9c.
Figure 9D:
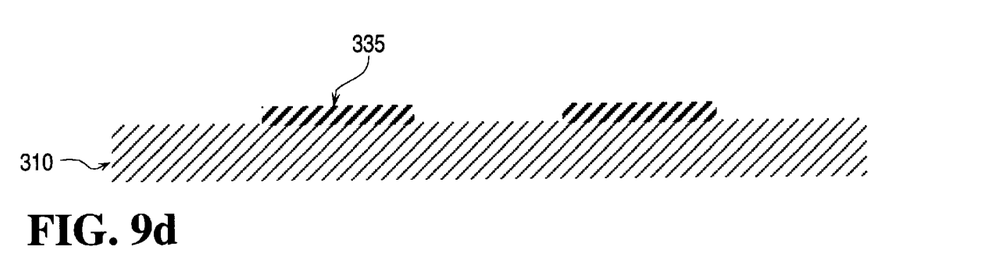
FIG. 9d is an illustration of a cross sectional view of an alternative fabrication process and mask embodiment, in furtherance of the fabrication steps illustrated in FIGS. 9a–9c.

An alternative embodiment to the mask fabrication process described above is to use a sacrificial material layer instead of the transmissive material layer as shown in FIG. 9a–9d. As shown in FIG. 9a, a substrate 310 with a layer of sacrificial material 320 deposited thereon is provided. The sacrificial material layer 320 is chosen to provide a combination of a selective plasma etch relative to the underlying material and vertical etch having smooth sidewalls. Photoresist 325 is deposited onto the sacrificial layer 320 and a pattern is written into the photoresist in accordance with a preselected layout pattern and the photoresist is developed to create openings 330 in the photoresist. The sacrificial material 320 layer is selectively plasma etched through the entire depth of the layer to leave etched portions 322 as shown in FIG. 9b. The selectiveness of the etch prevents the etch from going into the substrate layer. The remaining photoresist is removed. Then, an absorbing layer 335 is deposited as shown in FIG. 9b into the etched portions of the sacrificial layer 322, into the bottom as well as on the sidewalls. The mask surface is then planarized as shown in FIG. 9c to create an overall smooth, flat mask surface 330. The sacrificial layer 320 is then removed, typically by rinsing in an etching solution which etches the sacrificial layer selectively relative to the absorbing layer portions and the underlying surface. The remaining structure is as shown in FIG. 9d, that of a substrate with mask portions similar to the currently used mask, except with smooth, vertical sidewalls in the absorbing layer. And if desired, a capping material can be placed over the mask in a manner similar to that described above.

Phase Shift Mask Embodiment of the Invention

The present invention may also be used for making a phase shift mask. Whether in the case of a reflective mask or a transmissive mask, phase shifting materials can be embedded into a transmissive material portion in preselected areas so that the mask can perform phase shifting.

Figure 10:
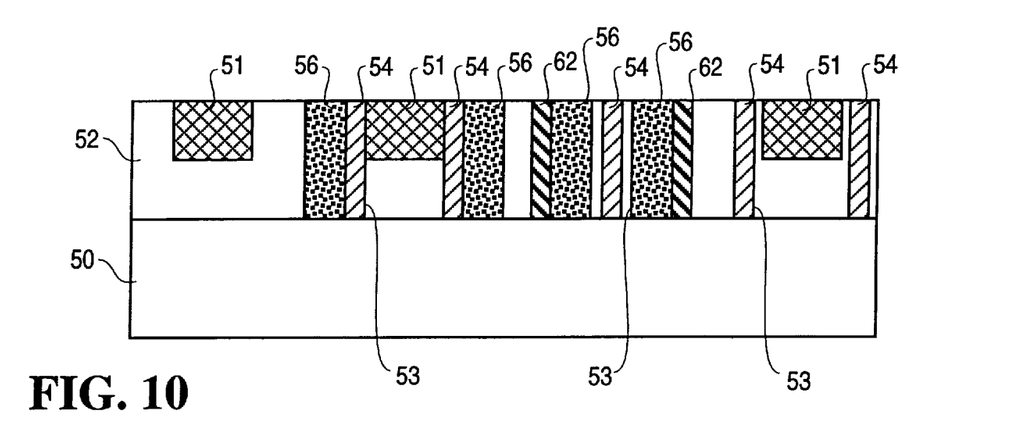
FIG. 10 is an illustration of a cross sectional view of a reflective phase shift mask embodiment of the present invention.

FIG. 10 illustrates an example of a transmissive material layer portion of a reflective mask phase shift mask application of the present invention. There is a substrate 50, which is reflective. Substrate 50 may have one or two or more layers (layers not shown) of reflective material or may be fabricated as a resonant reflector, as described above and not shown in detail here, depending on the desired degree of reflectivity for a given wavelength of light. Substrate 50 is coated with a transmissive material 52 to a predetermined thickness which will be, in a preferred embodiment, either equal to the thickness of the to-be-formed phase shift elements, or will be a greater thickness starting out for thinning down to a desired thickness with a planarization process. Transmissive material 52 may be silicon, quartz or other material as described above which is transmissive to the wavelength of light to be used and is capable of being plasma etched to form patterns within transmissive material 52. Absorbing portions 51 are preferably held within transmissive material 52 in accordance with the description above. Absorbing portions 51 may be made of alumimum or chromium or titanium or other material absorptive to the wavelength of light to be used, as described above. Note that absorbing portions 51 can be fabricated prior to fabrication of the phase shift material portions (described below). Absorbing portions 51 do not need to be extended through the entire thickness of transmissive material 52. Absorbing portions 51 can be embedded through a portion of the thickness of transmissive material 52 prior to formation of the phase shifting elements, in a sufficient amount so that absorbing portions 51 remain after any subsequent planarization transmissive material 52 may undergo, in an amount sufficient to effectively absorb the wavelength that absorbing portions 51 are intended to absorb. Transmissive material 52 is patterned preferably using a conventional photoresist patterning and etching technique to form patterns of trenches 53 within transmissive material 52 in accordance with a preselected phase shift material pattern design. Preferably, trenches 53 extend through the entire thickness of transmissive material 52. Trenches 53 are filled with phase shift material portion 54. Additional trenches 53 may be made and may be filled with additional phase shift material portions 56 and 62 encompassing differing phase shift materials for different phase shifting within a given mask. There are a number of phase shift material portions 54, 56, 62 which can be incorporated including more than the three shown here. The number of phase shift material portions depends on the number of different phase shifts desired; a commonly desired number of phase shifts is four, ranging between 0 and 180 degrees, to encompass the typical variations in pattern structures such as parallel lines, crossing lines, curvilinear and square structures. Because the mask structure of the present invention is planar as opposed to topographic, it is feasible to incorporate multiple phase shifters.

The degree of phase shifting for a given material can be determined by the relationship, $$\Delta\phi = 2\pi(n2-n1)d/\lambda,$$

where "$\Delta\phi$" is the phase shift, "n2" is the index of refraction of the phase shift material, "n1" is the index of refraction of the material through which the light travels just prior to reaching the phase shift material. Where "n1" is for air, the value of "n1" is 1. "D" is the thickness of the material, and "$\lambda$" is the wavelength of light being used in the stepper. The equation can be solved for d to obtain a thickness output for a given phase shift, index of refraction and wavelength:

$$d = \Delta\phi\lambda/(2\pi(n2-n1))$$

Thus, by designing in a desired phase shift, through iterative methods and/or through the use of software simulation tools for determining a desired phase shift for a given mask pattern, "$\Delta\phi$" is a known factor. In addition, "$\lambda$" is a known quantity, and "n2−n1" is known for a given material at a given wavelength. The equation can be solved for "d" to obtain the appropriate end thickness of phase shift material portion(s), which in the case of a reflective mask, is preferably equal to the thickness of transmissive layer 52.

Note that, if the phase shift desired is 180 degrees, or $\pi$, then the equation is simplified:

$$d=\lambda/(2(n2-n1))$$

By knowing "λ", and "n2" and "n1", the equation can be solved for "d".

The phase shift material selected is based on the needed index of refraction difference for a given wavelength of light. Possible phase shifting materials include doped silicon, dopants including boron, phosphorous, arsenic, nitrogen, oxygen and gallium. Other possible phase shift materials are silicon carbide, silicon nitride, silicon oxide, boron nitride, polyimide and other organic polymers, magnesium fluoride, thorium fluoride, and indium tin oxide. The particular phase shift material selected is dependent on the wavelength and thickness requirements and of course, the phase shift requirements for a given mask pattern. "D" should be as thin as practicable, preferably around 500 to 2000 Angstroms in thickness. In the case of a reflective mask, "d" may need to be as thin as 200 Angstroms to reduce the absorptive effects of the material used for the transmissive layer 52.

The fabrication process for the reflective phase shift mask in accordance with the invention is similar to the general planar fabrication technique described above. Using a known photolithography patterning and etching technique, a trench portion 53 to form first phase shift material portion 54 is created in transmissive layer 52 in accordance with the dimensions of a predetermined pattern. Trench portion 53 is shown here to be extended completely through the entire thickness of transmissive layer 52. First phase shift material portion 54 is preferably formed by blanket depositing a preselected phase shift material into trench portion 53, using chemical vapor deposition or other fabrication technique which will fill the trench completely, so that phase shift material is formed both within trench portion 53 and on the top surface of transmissive material 52. Then, a planarization technique such as chemical mechanical polish is used to planarize the phase shift material so that the top surface of phase shift material portion 54 is planar with the top surface of transmissive material portion 52. Planarization must be carried out in a controlled manner to remove a preset thickness of transmissive material 52 so that the final thickness after fabrication is complete will be "d". Note that if multiple phase shifting materials will be used to create different phase changes in a reflective mask, the materials must be chosen so that the equation provided above for differing materials will have the same resultant "d".

An alternative processing technique for forming phase shift material portion 54 is to use a mask to cover transmissive layer 52 in all areas except for those regions where phase shift material portion 54 is to be formed. Then, transmissive layer 52 is exposed to ion implantation or other doping technique to dope transmissive layer 52 with a dopant in a sufficient concentration to effect a preselected degree of change in the index of refraction. To use the ion implantation technique, transmissive layer 52 must be made of a material for which the index of refraction can be modified using known ion implantation doping techniques. An example of such a material is silicon.

This process sequence of patterning trenches, forming phase shift material and planarizing, can be repeated for adding second phase shift material portion 56, third phase shift material portion 62 and so on, preferably up to a fourth phase shift material portion (not shown).

After fabrication of all phase shift material portions is complete, the mask can be capped with a protective layer (not shown) as described above.

Figure 11:
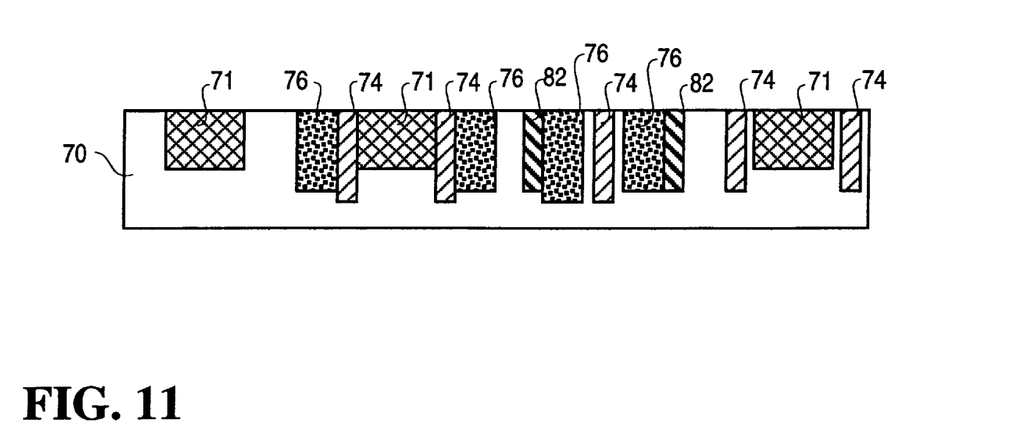
FIG. 11 is an illustration of a cross sectional view of a transmissive phase shift mask embodiment of the present invention.

FIG. 11 illustrates a transmissive material portion 70 of a transmissive mask having phase shifting portions. Transmissive material portion 70 is either a layer of transmissive material over a transmissive material substrate (not shown) or is the same thing as the substrate, the entire substrate being a single, transmissive layer of material. A phase shift mask in a transmissive mask embodiment is similar to the mask described as a reflective mask embodiment above. Transmissive material portion 70 preferably contains absorbing material portions 71 and contains phase shift material portions 74, 76 and 82. In a similar manner, there can be any number of phase shifting portions as required to perform the needed phase shifting for a given pattern type; it is generally preferred that up to four phase shift materials are used. The fabrication process sequence is also similar to that described above for the reflective phase shift mask, the area of difference being that, in the case of a transmissive mask, phase shift material portions 74, 76 and 82 may extend through only a portion of the thickness of transmissive material portion 70. Thus, the thickness of the phase shift material can be independent of the thickness of transmissive material portion 70, and each phase shift material may be of a different thickness relative to one another, depending on the outcome of the equation solved for "d" above, for given phase shifts and phase shift materials having individual indices of refraction at a given wavelength of light. In the case of the transmissive mask, phase shifting portions 74, 76 and 82 can be effectively stacked over a thickness of transmissive material portion 70. Note that, because the "d" is independent of the thickness of transmissive material 70, and different values of "d" can create different phase shifts for a given phase shifting material, a single phase shifting material can be used instead of multiple materials, at varying "d"s, to attain the desired phase shifts.

The planar phase shift mask fabrication technique can therefore be used for both transmissive and reflective masks, and is not limited by light wavelength.

As an example of how the mask of the invention can be used in a photolithography process, a substrate, usually a silicon wafer, containing a material of film to be patterned and covered with patterned photoresist is placed within a stepper onto a holder. A mask having a planarized substantially smooth surface is provided. Note that the planarized substantially smooth surface can be obtained by the fabrication processes described above for the transmissive mask or reflective mask including or not including a capping layer. The planarized substantially smooth surface can also be attained on a topographic mask surface by placing a capping material layer thereon as described above. Then, light at a previously selected wavelength is applied to the mask so that the pattern of the mask is replicated onto the photoresist covering the substrate. Finally, the substrate is removed from the stepper.

Thus, a novel mask for photolithography and fabrication method is disclosed. While the present invention has been described with reference to specific embodiments thereof, many variations of the present invention will be obvious to one skilled in the art and are considered to be within the scope and spirit of the present invention.

We claim:

1. A phase shift mask structure comprising:
   a first layer of material that is transmissive;
   a trench formed in said first layer;
   a phase shifting material comprising doped silicon formed within said trench, the top surface of the phase shifting material being exposed; and
   wherein the top surface of the mask structure is substantially smooth and planar.

2. The mask structure of claim 1, further comprising a second trench formed in said first layer, said second trench containing an absorbing layer.

3. The mask structure of claim 2, wherein said absorbing layer is comprised of aluminum, titanium, or chromium.

4. The mask structure of claim 1, wherein said first layer is comprised of silicon, quartz, calcium fluoride, magnesium fluoride, or indium tin oxide.

5. A phase shift mask structure comprising:

a planar first layer of material that is transmissive;

a plurality of trenches in said first layer; and phase shifting material having different refractive properties formed within said plurality of trenches.

6. A method of fabricating a photolithography mask, comprising:

providing a substrate;

forming on said substrate a first layer of material that is transmissive;

forming first and second trenches in said first layer;

forming first and second phase shifting materials having different refractive properties within said first and second trenches; and planarizing the surface of said mask exposing said phase shifting materials.

7. A method of fabricating a mask as in claim 6, further comprising the step of repairing defects in said first layer.

8. A method of fabricating a mask as in claim 6, further comprising:

forming a third trench in said first layer; and forming a third phase shifting material having different refractive properties from those of said first and second phase shifting materials within said third trench.

9. A method of fabricating a mask as in claim 8, further comprising:

forming a fourth trench in said first layer; and forming a fourth phase shifting material having different refractive properties from those of said first, second and third phase shifting materials within said fourth trench.

10. A method of fabricating a mask as in claim 6, wherein said first layer comprises silicon, quartz, calcium fluoride, magnesium fluoride or indium tin oxide.

11. A method of fabricating a mask as in claim 6, further comprising forming a third trench in said first layer, and forming within said third trench an absorbing layer.

12. A method of fabricating a mask as in claim 11, wherein said absorbing portion comprises aluminum, titanium or chromium.

13. A method of fabricating a mask for use in photolithography, comprising:

providing a planar first layer of material that is transmissive; and forming first and second phase shift materials having different refractive properties within first and second trenches formed within said first layer, said phase shift materials being substantially planar with the top surface of said first layer.

14. A method of fabricating a mask as in claim 13, wherein said step of forming first and second phase shift materials includes doping said first layer in preselected areas to alter the refractive index of said first layer to create a preselected phase shift.

15. A method of fabricating a mask as in claim 13, wherein said phase shift materials are selected from the group consisting of doped silicon, silicon carbide, silicon nitride, silicon oxide, boron nitride, organic polymer, magnesium fluoride, thorium fluoride and indium tin oxide.

16. A method of fabricating a mask as in claim 13, further comprising the step of forming absorbing portions within said first layer.

17. A method of fabricating a mask as in claim 13, wherein said absorbing portions comprise aluminum, titanium or chromium.

* * * * *